US010569501B2

(12) United States Patent
Lim et al.

(10) Patent No.: US 10,569,501 B2
(45) Date of Patent: Feb. 25, 2020

(54) DISPLAY DEVICE AND MANUFACTURING METHOD THEREOF (71) Applicant: Samsung Display Co., Ltd., Yongin-si, Gyeonggi-do (KR)

(72) Inventors: Jae Ik Lim, Hwaseong-si (KR); Jin Woo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/833,934

(22) Filed: Dec. 6, 2017

(65) Prior Publication Data
US 2018/0162095 A1  Jun. 14, 2018

(30) Foreign Application Priority Data

Dec. 13, 2016  (KR) .......................... 10-2016-0169804

(51) Int. Cl.
*H05K 5/00* (2006.01)
*B32B 5/18* (2006.01)
(Continued)

(52) U.S. Cl.
CPC .................. *B32B 5/18* (2013.01); *B32B 7/02* (2013.01); *B32B 27/06* (2013.01); *B32B 37/06* (2013.01); *H01L 51/003* (2013.01); *H01L 51/0097* (2013.01); *H05K 5/0017* (2013.01); B32B 2307/306 (2013.01); B32B 2457/20 (2013.01); *H01L 27/32* (2013.01); *Y02E 10/549* (2013.01)

(58) Field of Classification Search
CPC ....................................................... H05K 5/00
See application file for complete search history.

(56) References Cited

U.S. PATENT DOCUMENTS

2014/0042406 A1* 2/2014 Degner ................ H01L 27/326
257/40
2015/0210588 A1* 7/2015 Chang ................... C03C 21/002
361/750

(Continued)

FOREIGN PATENT DOCUMENTS

KR  10-2012-0016906 A  2/2012
KR  10-2014-0077583 A  6/2014
(Continued)

OTHER PUBLICATIONS

Sepe, Materials: The Problems with Single-Point Data, Part 7, Plastics Technology, Columns Post: Nov. 23, 2015, http://www.ptonline.com/columns/materials-the-problems-with-single-point-data-part-7, 4 pages.

(Continued)

*Primary Examiner* — Jerry Wu
(74) *Attorney, Agent, or Firm* — Lewis Roca Rothgerber Christie LLP (57) ABSTRACT A display device includes: a display panel including a display area and a non-display area that extends from an end of the display area and is bent toward the display area; and a passivation film including a first film portion that is attached to a surface of the non-display area and is bent toward the display area, and a second film portion that is attached to a surface of the display area, and a modulus of the first film portion is lower than a modulus of the second film portion.

20 Claims, 10 Drawing Sheets (51) Int. Cl.
*B32B 7/02* (2019.01)
*H01L 51/00* (2006.01)
*B32B 37/06* (2006.01)
*B32B 27/06* (2006.01)
*H01L 27/32* (2006.01)

(56) References Cited

U.S. PATENT DOCUMENTS

2015/0346566 A1* 12/2015 Nakamura ........ G02F 1/134363
　　　　　　　　　　　　　　　　　　　　349/138
2016/0275830 A1　　9/2016 You et al.

FOREIGN PATENT DOCUMENTS

| KR | 10-2014-0078182 A | 6/2014 |
| KR | 10-2014-0123868 A | 10/2014 |
| KR | 10-2015-0035306 A | 4/2015 |
| KR | 10-2015-0124542 A | 11/2015 |
| KR | 10-2016-0088487 A | 7/2016 |

OTHER PUBLICATIONS

Kaltenbrunner et al., An ultra-lightweight design for imperceptible plastic electronics, Nature, vol. 499, Jul. 25, 2013, pp. 458-465.

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2016-0169804, filed on Dec. 13, 2016 in the Korean Intellectual Property Office, the entire content of which is incorporated herein by reference.

BACKGROUND

1. Field

Aspects of embodiments of the present disclosure relate to a display device and a manufacturing method thereof.

2. Description of the Related Art

As various display devices, such as a mobile phone, a tablet PC, a laptop PC, a computer monitor, and a TV are increasingly used, a demand for quality improvement of the display devices is also increasing.

In a case of the display device, there are quality demands for improving performance of a screen, such as resolution of the screen and performance for reducing power consumption, and, in a case of a portable electronic device, it is an important quality improvement target to reduce weight thereof such that it may be portable and to ensure visibility such that a screen thereof may be smoothly displayed to the outside.

In addition, an effort to reduce a non-display area corresponding to an area other than a display area of the screen of the display device is also increasing such that an image may be displayed on an entire area of the screen. When a display device includes a display area formed at a front side thereof, it is easier to connect a plurality of the display devices to realize a single large screen, the display device may be applied to various displays having various operating modes such as a transparent display, a foldable display, and a rollable display, and the display device may be applied to various other fields.

However, in the non-display area, since there are constituent elements, such as a circuit wire, a connection pad, and a driving chip, connected to the outside in order to supply an electrical signal and power to the display area, it is difficult to completely eliminate or separate the non-display area from the display area.

The above information disclosed in this Background section is only for enhancement of understanding of the background of the invention and, therefore, it may contain information that does not form the prior art that is already known in this country to a person of ordinary skill in the art.

SUMMARY

According to an aspect of embodiments of the present disclosure, a display device and a manufacturing method thereof are provided in which the display device may be prevented from being damaged due to bending.

However, aspects to be achieved by the present disclosure are not limited to the aforementioned aspect, and other aspects will be understood by those skilled in the art from the description below.

According to one or more exemplary embodiments of the present disclosure, a manufacturing method of a display device includes: attaching a first film portion on a carrier substrate; attaching a second film portion extending from one side of the first film portion on the carrier substrate to prepare a passivation film; separating the carrier substrate from the passivation film; attaching a display panel to one surface of the passivation film; locally heating the first film portion; and bending the first film portion and a portion of the display panel.

The first film portion may be made of a thermoplastic material, and the second film portion may be made of a heat resistant material.

A glass transition temperature of the first film portion may be lower than a glass transition temperature of the second film portion.

In the heating of the first film portion, the first film portion may be heated to a temperature of equal to or greater than the glass transition temperature of the first film portion and heated to a temperature of less than the glass transition temperature of the second film portion.

The manufacturing method of the display device may further include forming a neutral surface adjustment member on a surface of the display panel opposite to a surface of the display panel attached to the first film portion.

According to one or more exemplary embodiments of the present disclosure, a manufacturing method of a display device includes: coating a passivation film resin including a curable material on a carrier substrate; primarily curing a second film portion of the passivation film resin except for a first film portion by arranging a mask blocking the first film portion of the passivation film resin; removing the mask and then secondarily curing all of the passivation film resin to prepare a passivation film; and attaching the passivation film and a display panel such that a non-display area of the display panel including a display area and the non-display area is arranged on the first film portion, and the display area thereof is arranged on the second film portion.

The mask may be a full-tone mask or a half-tone mask.

The passivation film resin including the curable material may be cured by light or heat, and in each of the primarily curing and the secondarily curing, light or heat may be applied to the passivation film resin.

According to one or more exemplary embodiments of the present disclosure, a manufacturing method of a display device includes: attaching a material for the passivation film on a carrier substrate; forming a plurality of pores in a first film portion of the passivation film; attaching a display panel to a surface of the material for the passivation film such that the first film portion is arranged on a non-display area of the display panel that includes a display area and the non-display area, and such that the second film portion corresponding to an area excluding the first film portion is arranged on the display area; and bending the first film portion and the non-display area.

The manufacturing method of the display device may further include etching the plurality of pores.

The plurality of pores may be formed by a laser process or a punching process.

The manufacturing method of the display device may further include filling a filler having a lower modulus than a modulus of the material for the passivation film in the plurality of pores.

According to one or more exemplary embodiments of the present disclosure, a display device includes: a display panel including a display area and a non-display area that extends from an end of the display area and is bent toward the display area; and a passivation film including a first film portion that is attached to a surface of the non-display area and is bent toward the display area, and a second film portion that is attached to a surface of the display area, and a modulus of the first film portion is lower than a modulus of the second film portion.

The first film portion may be made of a thermoplastic material, and the second film portion may be made of a heat resistant material.

A glass transition temperature of the first film portion may be lower than a glass transition temperature of the second film portion.

The first film portion may include a plurality of pores.

The passivation film may have a lower modulus than a modulus of the first film portion, and may include a filler filled in the plurality of pores.

Each of the first film portion and the second film portion may include a curable material, and a concentration of the curable material of the second film portion may be higher than a concentration of the curable material of the first film portion.

The first film portion and the second film portion including the curable material may be respectively cured by light or heat.

The display device may further include a neutral surface adjustment member formed on a surface of the non-display area opposite to a surface of the non-display area attached to the first film portion.

According to an aspect of one or more embodiments of the present disclosure, when a non-display area is bent toward an opposite side of a display surface of a display area so as to reduce the non-display area, stress and deformation generated due to bending are reduced, and it is possible to prevent a display panel from being physically damaged.

DESCRIPTION OF SYMBOLS

10: carrier substrate
20: mask
22: half-tone mask
100: passivation film
100a: passivation film resin
110: first film portion
120: second film portion
130: pore
140: filler
150: neutral surface adjustment member
200: display panel
210: non-display area
220: display area
A: curable material

DETAILED DESCRIPTION

Some exemplary embodiments of the present disclosure will be described in further detail with reference to the accompanying drawings. In describing the present disclosure, a description of known functions or configurations may be omitted so as to make the subject matter of the present disclosure more clear.

To more clearly describe the present disclosure, portions which do not relate to the description may be omitted, and like reference numerals designate like elements throughout the specification. The size and thickness of each component shown in the drawings may be arbitrarily shown for better understanding and ease of description, but the present disclosure is not limited thereto.

In the drawings, the thicknesses of layers, films, panels, regions, area, etc., may be exaggerated for clarity. It will be understood that when an element, such as a layer, film, region, or substrate is referred to as being "on" another element, it may be be directly on the other element, or one or more intervening elements may also be present.

Figure 1:
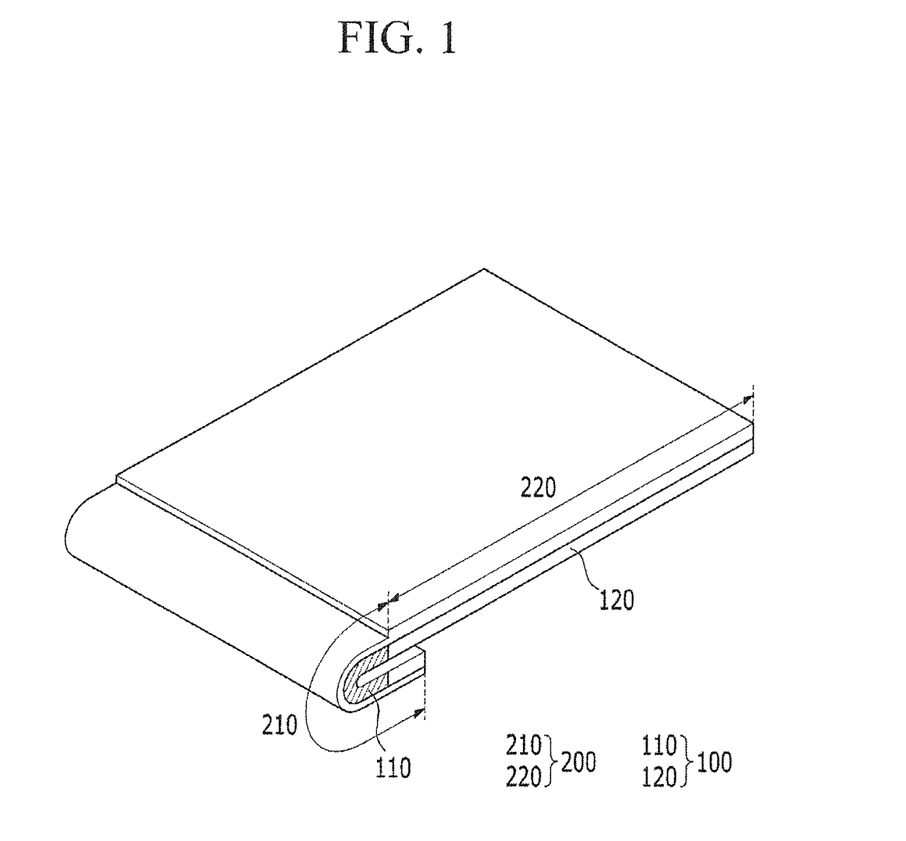
FIG. 1 illustrates a part of a display device according to an exemplary embodiment of the present disclosure.
Figure 2:
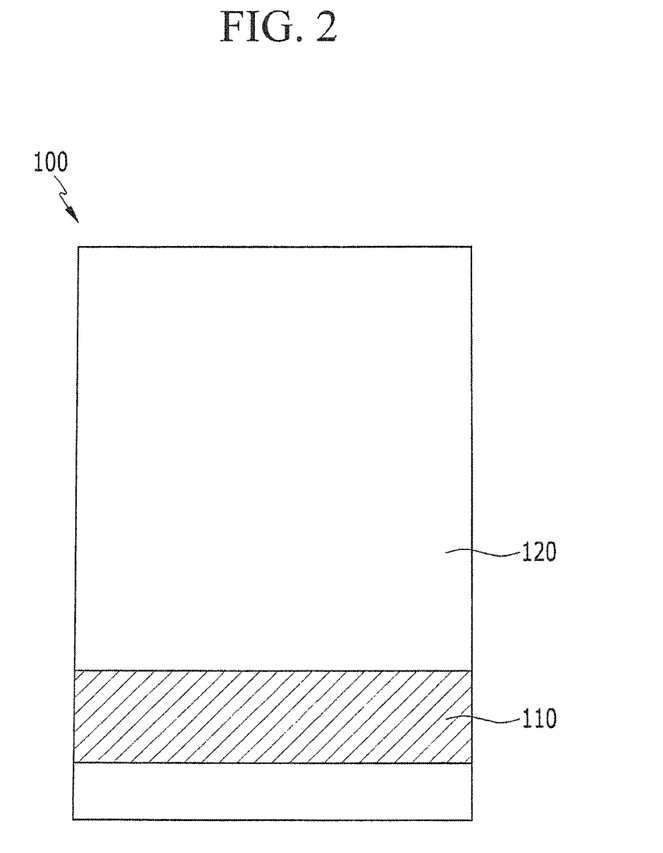
FIG. 2 illustrates a top plan view of a passivation film according to an exemplary embodiment of the present disclosure.

Herein, a display device and a manufacturing method thereof according to an exemplary embodiment of the present disclosure will be described with reference to FIG. 1 to FIG. 9. FIG. 1 illustrates a part of a display device according to an exemplary embodiment of the present disclosure; FIG. 2 illustrates a top plan view of a passivation film 100 according to an exemplary embodiment of the present disclosure; and FIG. 3 to FIG. 7 sequentially illustrate processes of manufacturing a display device, such as the display device of FIG. 1, according to an exemplary embodiment of the present disclosure.

A display device of the present exemplary embodiment includes a display panel 200 and the passivation film 100.

The display panel 200 includes a display area 220 provided with a plurality of pixels for displaying a screen, and a non-display area 210 extending from an end of the display area 220 to be bent.

A pixel positioned in the display area 220 realizes a primary color required to display the screen to represent the screen. Generally, each pixel emits red, green, or blue light, but the present disclosure is not limited thereto, and may include a pixel emitting white light. In addition, a pixel may emit various colors for realizing the screen.

The display area 220 includes a display element that is positioned therein, controls an amount of light supplied from the outside, or emits light by itself. Each display element is disposed to correspond to each of the plurality of pixels. A display element layer included in the display panel 200 of the present exemplary embodiment may include any of various display elements such as a liquid crystal layer and an organic light emitting element layer, and may also include any of various other display elements. However, the display elements may be variously changed, such that the scope of the present disclosure is not limited.

The non-display area 210 is a portion through which wires connected to respective pixels are collectively passed such that wires for supplying an electrical signal and power to respective pixels positioned in the display area 220 may be electrically connected to the outside.

In the display device, it may be desired to enlarge the display area 220 as much as possible and to reduce a peripheral area including the non-display area 210. When the peripheral area is reduced, even if a size of an actual screen is not increased, since a ratio of the display area 220 occupying the display device increases, it is possible to obtain the same effect as increasing the size of the screen. Ultimately, it may be possible to completely eliminate a bezel portion including the peripheral area.

For this purpose, the peripheral area including an area in which the display area 220 is excluded from the display panel 200, that is, the non-display area 210, is bent to the opposite side of the display surface of the display area 220. The bent non-display area 210 has a letter "U" or "J" shape.

In this case, physical stress may be concentrated at the bent portion due to the bending and, in a typical case, may result in physical breakage. However, according to embodiments of the present disclosure, physical breakage which may be caused due to the bending is prevented or substantially prevented.

The passivation film 100 is attached to a surface of the display panel 200 and, in an embodiment, to a lower surface of the display panel 200 opposite to a display surface thereof. The passivation film 100 is attached to a surface of the non-display area 210, and includes a first film portion 110 and a second film portion 120. The passivation film 100 is attached to a surface of the display area 220 to prevent or substantially prevent foreign materials from the outside such as air and moisture from penetrating into the display device and to protect the display area from external impact.

The first film portion 110 is bent together with the non-display area 210 when the non-display area 210 is bent. The first film portion 110 has a lower modulus than a modulus of the second film portion 120.

The first film portion 110 and the second film portion 120 according to an exemplary embodiment of the present disclosure include materials having different moduli. Thus, the first film portion has a lower modulus than the second film portion 120. The first film portion 110 may be made of a material having a lower modulus than the second film portion 120.

In an embodiment, for example, the first film portion 110 may include any of materials such as polydimethylsiloxane (PDMS), polyurethane, and silicone, and the second film portion 120 thereof may include any of materials such as an acryl-based compound, polyethylene terephthalate (PET), or polyimide (PI). However, these materials are merely provided as examples, and other materials may be selected in consideration of a modulus difference therebetween and various physical properties applicable to other display devices.

FIG. 2 schematically illustrates a top plan view of the passivation film 100 including the first film portion 110 in an area thereof and the second film portion 120 in a remaining area thereof. Referring to FIG. 2, an exemplary embodiment in which the second film portion 120 is disconnected or partitioned by the first film portion 110 is shown. However, this is merely provided as an example, and, although not shown, an exemplary variation in which the first film portion 110 extends from a side of the second film portion 120 to an end portion of the passivation film 100 is possible.

A method of manufacturing a display device, such as the display device shown in FIG. 1, will be schematically described with reference to process sequences shown in FIG. 3 to FIG. 7. FIG. 3 to FIG. 7 schematically and sequentially illustrate processes of a method of manufacturing the display device as shown in FIG. 1. However, this is merely provided as an example, and the sequences and details of the process may be varied.

Figure 3:
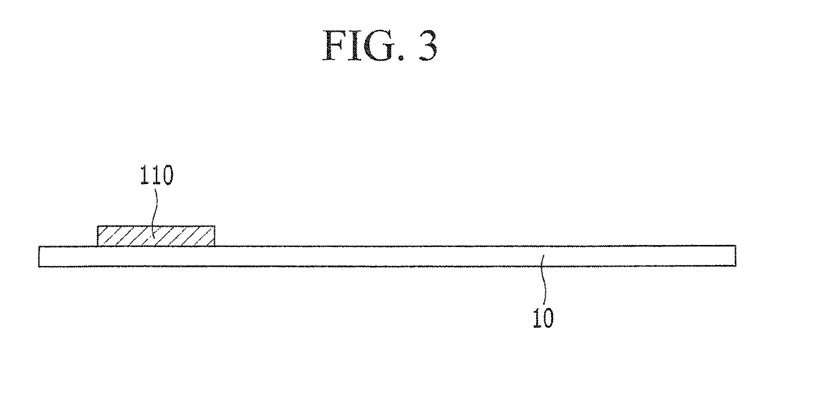
FIG. 3 to FIG. 7 sequentially illustrate processes of manufacturing a display device, according to an exemplary embodiment of the present disclosure.

Referring to FIG. 3, in an embodiment, the first film portion 110 is formed on a carrier substrate 10. The carrier substrate 10 may be made of a rigid material, such as glass, a metal, or the like.

Figure 4:
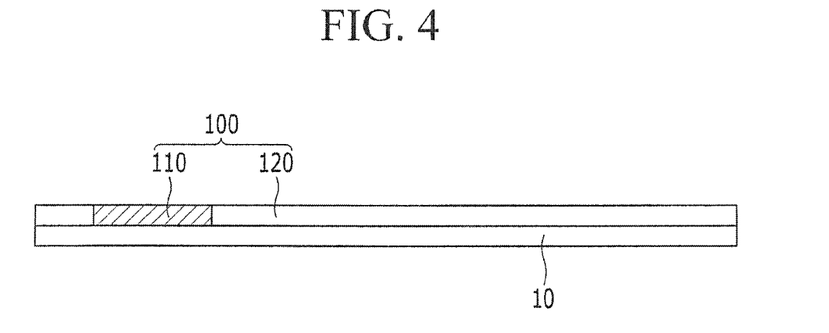

As shown in FIG. 4, the second film portion 120 connected to at least one side (that is, one side and an opposite side) of the first film portion 110 is formed on the carrier substrate 10 to manufacture the passivation film 100.

Figure 5:
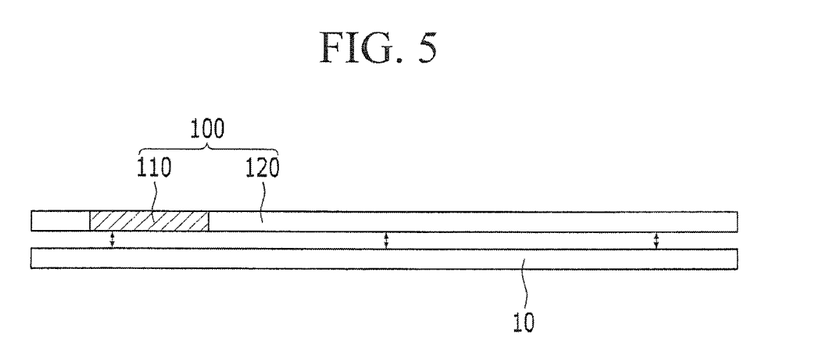

Next, as shown in FIG. 5, the passivation film 100 formed on the carrier substrate 10 is separated from the carrier substrate 10. As such, the first film portion 110 and the second film portion 120 are connected to each other on the carrier substrate 10 to complete the passivation film 100, and then the passivation film 100 is separated from the carrier substrate 10.

Figure 6:
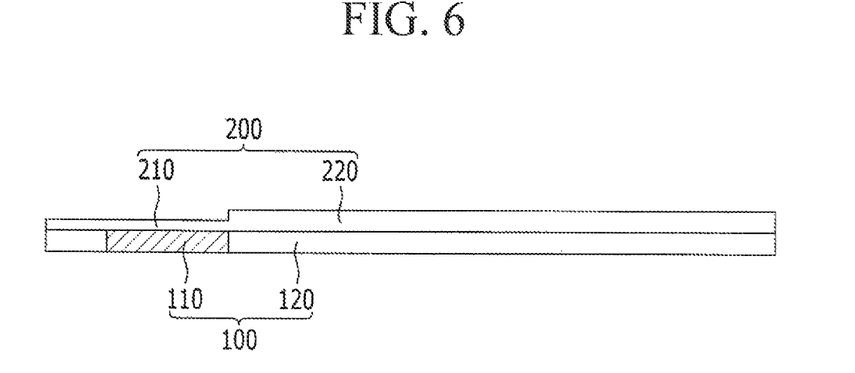

Next, as shown in FIG. 6, the passivation film 100 is attached to a surface of the display panel 200. In this case, the display panel 200 of the present exemplary embodiment includes the display area 220 and the non-display area 210. In an embodiment, the second film portion 120 of the passivation film 100 is attached to the display area 220 of the display panel 200, and the first film portion 110 and some of the second film portion 120 of the passivation film 100 are attached to the non-display area 210 of the display panel 200.

Figure 7:
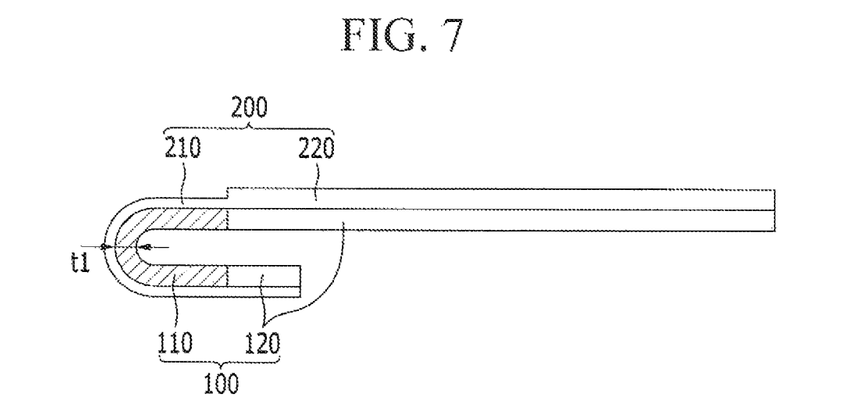

Next, in an embodiment, the first film portion 110 and the non-display area 210 are locally heated, and then are bent, as shown in FIG. 7.

According to the exemplary embodiment shown in FIG. 4 to FIG. 7, the second film portion 120 is formed on opposite sides of the first film portion 110, and then attached to the display panel 200 which is then bent. However, the present disclosure is not limited thereto, and, although not shown, in an exemplary variation, the second film portion 120 is formed on only one side of the first film portion 110, then the passivation film 100 and the display panel 200 are bent, and the first film portion 110 is extended to an outermost end of the passivation film 100.

According to an exemplary embodiment, the first film portion 110 may include a thermoplastic material, and the second film portion 120 may include a heat resistant material. In an embodiment, for example, the first film portion 110 may be a thermoformed polycarbonate, and the second film portion 120 may be a heat resistant polyethylene terephthalate. However, this is merely provided as an example, and various other materials may be applied in consideration of heat characteristics, optical characteristics, and mechanical characteristics related to the modulus.

In an embodiment, the first film portion 110 includes the thermoplastic material and the second film portion 120 includes the heat resistant material, and when the first film portion 110 is locally heated, only the first film portion 110 may be deformed by heat, and since the second film portion 120 has heat resistance, it is not deformed, even at a high temperature, to maintain its original state.

In an embodiment, a glass transition temperature of the first film portion 110 may be lower than that of the second film portion 120. Therefore, when the passivation film 100 is heated to a temperature higher than the glass transition temperature of the first film portion 110 and a temperature lower than that of the second film portion 120, only the first film portion 110 may be vitrified, and the second film portion 120 may maintain its original state.

In an embodiment, the first film portion 110 may include a material of which modulus is rapidly decreased at a temperature higher than the glass transition temperature. Thus, when heated to a temperature higher than the glass transition temperature of the first film portion 110, the first film portion 110 is vitrified and has a low modulus. In this case, when the first film portion 110 and the non-display area 210 attached to the first film portion 110 are bent, stress and strain applied to the first film portion 110 and the non-display area 210 attached to the first film portion 110 due to bending may be reduced.

Figure 8:
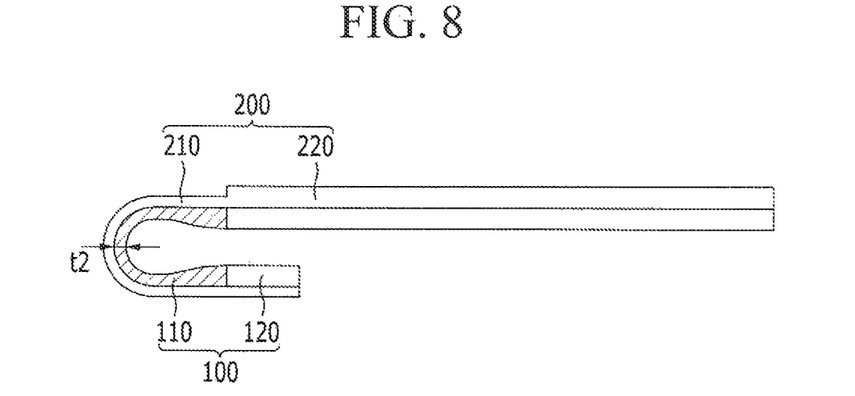
FIG. 8 illustrates a cross-sectional view of a display device including a thermally deformed first film portion.

In FIG. 8, the first film portion 110 and the non-display area 210 attached to the first film portion 110 that are thermally deformed by heating, are exaggeratedly shown. When the first film portion 110 vitrified by applying heat to the first film portion 110 of the passivation film 100 is bent, a length thereof may be increased and a thickness thereof reduced. FIG. 7 illustrates the first film portion 110 maintaining a thickness of t1 while being bent, but when the first film portion 110 vitrified by heat is bent, the length thereof may be increased and the thickness thereof reduced, such that the thickness thereof become t2. As described above, when t1 shown in FIG. 7 is compared with t2 shown in FIG. 8, t1 is thicker than t2.

Since the thickness is one of factors affecting the modulus, the thinner the thickness, the smaller the modulus, and the thicker the thickness, the greater the modulus.

According to the present exemplary embodiment, the first film portion 110 is vitrified by heating to lower the modulus, and the thickness is reduced to further reduce the modulus. Thus, when the first film portion 110 and the non-display area 210 attached to the first film portion 110 are bent, it is possible to provide the manufacturing method of the display device capable of preventing or substantially preventing physical breakage by reducing stress and strain.

In addition, when a temperature decreases, the rigidity of the first film portion 110 thermally deformed as in the present embodiment may be restored, and, thus, permanent deformation thereof is possible. Accordingly, the first film portion 110 and the non-display area 210 of the present exemplary embodiment may maintain a letter "U" or "J" shape after the heating process is finished. Further, even if no external force is applied thereto from the outside, since a restoring force to be restored to a flat shape is not applied thereto, there is no need for a process for fixing an end portion of a bent portion.

However, the present disclosure is not limited thereto, and the first film portion 110 according to a variation of the present exemplary embodiment may include a material of which modulus is reduced by light rather than by heat.

For example, the modulus of the first film portion 110 of an exemplary variation may be reduced when light of a wavelength (e.g., a predetermined wavelength) is irradiated. Examples of such materials may include materials such as polydimethylsiloxane (PDMS) membranes. Accordingly, only the first film portion 110 including a material such as a polydimethylsiloxane (PDMS) membrane may be exposed to light to reduce the modulus, and then may be bent. Even in the present exemplary variation, after the light is removed, the reduced modulus of the first film portion 110 may be recovered to the original modulus again such that the first film portion 110 may be permanently deformed, and, thus, the restoring force may not be applied to the bent area as described above.

Figure 9:
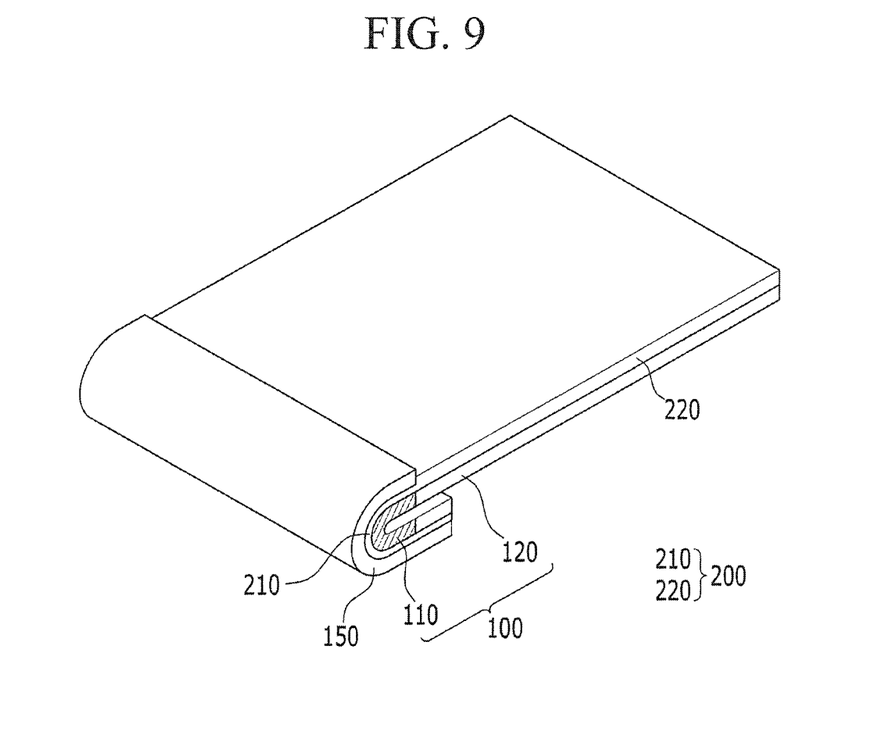
FIG. 9 illustrates a part of a display device according to an exemplary embodiment of the present disclosure.
Figure 10:
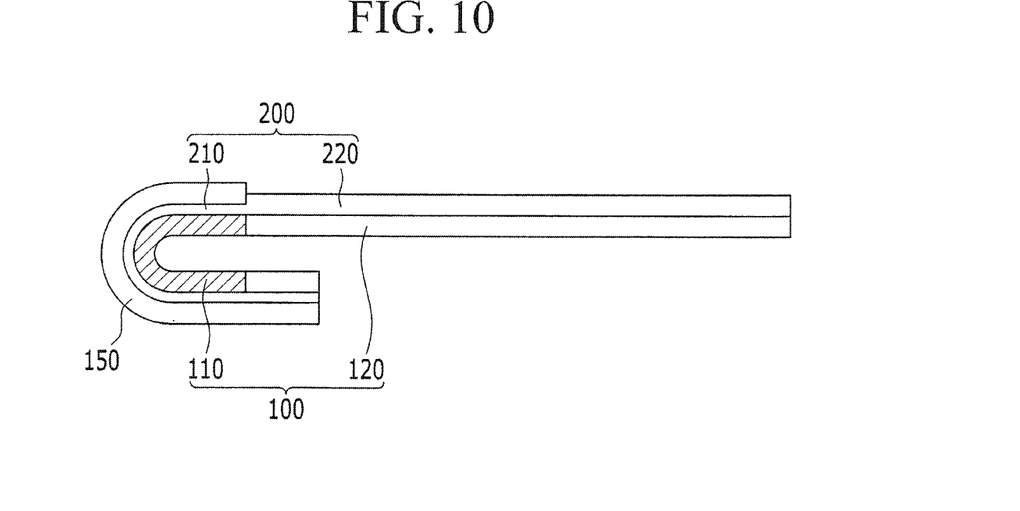
FIG. 10 illustrates a cross-sectional view of the display device of FIG. 9.

FIG. 9 and FIG. 10 illustrate a display device according to an exemplary embodiment of the present disclosure. FIG. 9 illustrates a part of a display device according to an exemplary embodiment of the present disclosure; and FIG. 10 illustrates a cross-sectional view of the display device of FIG. 9.

The display device of FIG. 9 and FIG. 10, which is similar to the exemplary embodiment described above with respect to FIG. 1, further includes a neutral surface adjustment member 150 attached to a side of the non-display area 210 opposite that attached to the first film portion 110. The neutral surface adjustment member 150 shown in FIG. 9 and FIG. 10 increases a thickness of the bent area (that is, the first film portion 110 and the non-display area 210) to adjust a formation position of a neutral surface formed by bending. The display panel 200 according to the present embodiment has a structure in which a plurality of layers including various materials are stacked. In this case, a plurality of organic layers and a plurality of inorganic layers may be stacked in various orders. When the neutral surface generated in bending is formed in the inorganic layer, the bending is difficult due to brittleness of the inorganic layer. The neutral surface adjustment member 150 of the present exemplary embodiment controls the formation position of the neutral surface such that the neutral surface is formed in the organic layer which is easier to deform than the inorganic layer by adjusting the thickness of the bent area.

The neutral surface adjustment member 150 of the present exemplary embodiment has a low modulus. Thus, the thickness of the entire bent area may be increased, thereby minimizing or reducing problems that may be caused by the increased modulus.

The display device and a manufacturing method thereof according to an exemplary embodiment of the present disclosure have been described above. Herein, a display device and a manufacturing method thereof according to another exemplary embodiment of the present disclosure will be described with reference to FIG. 11 to FIG. 14. Here, further description of configurations that are the same as those of the above-described exemplary embodiment of the present disclosure will be omitted.

Figure 11:
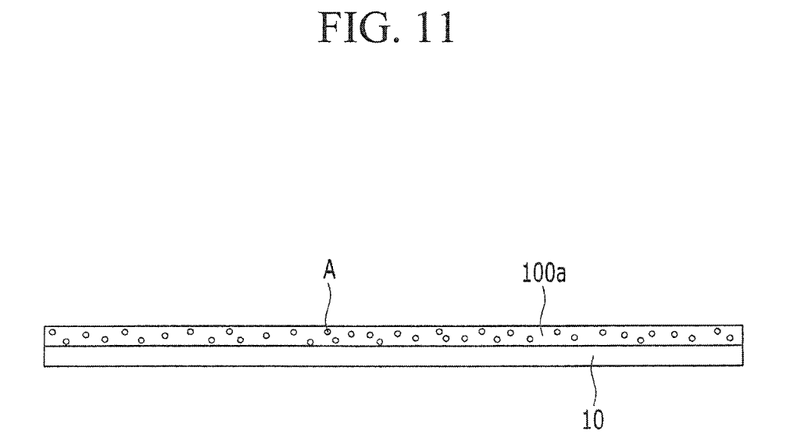
FIG. 11 to FIG. 13 sequentially illustrate processes of manufacturing a passivation film according to another exemplary embodiment of the present disclosure.
Figure 12:
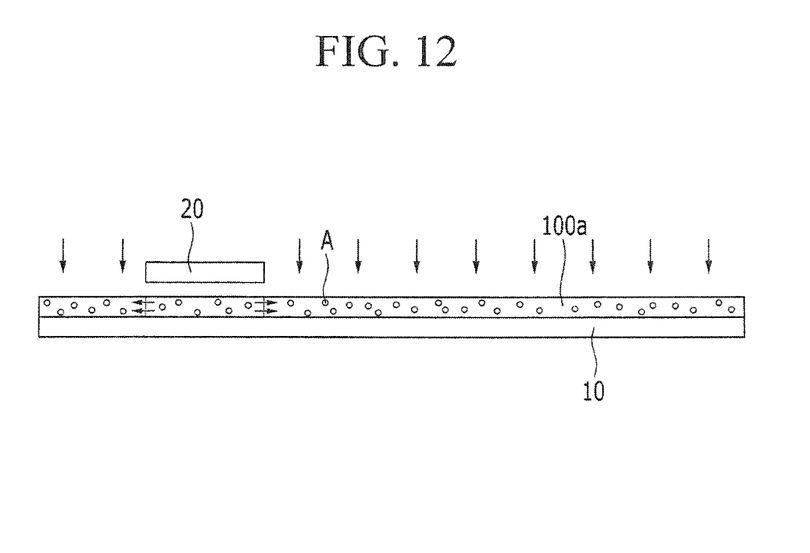
Figure 13:
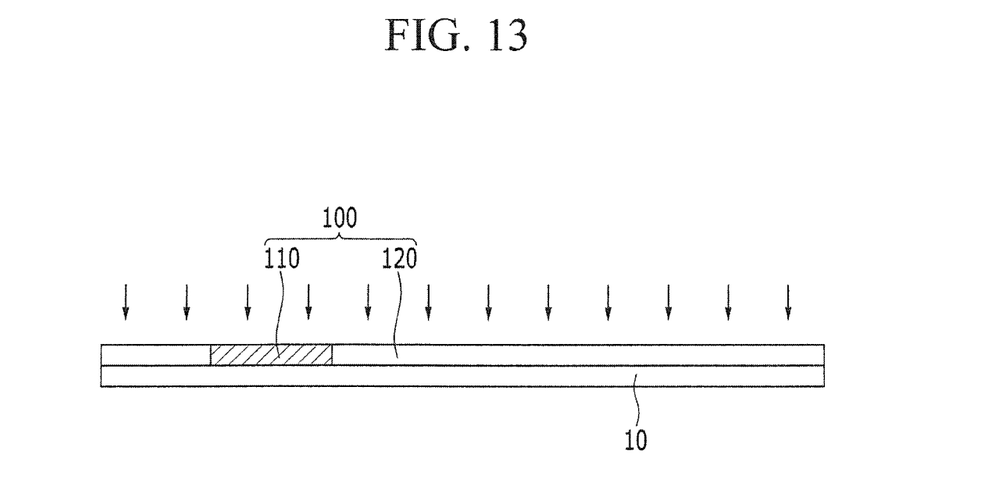

FIG. 11 to FIG. 13 sequentially illustrate processes of manufacturing a passivation film 100 according to another exemplary embodiment of the present disclosure. In the display device according to another exemplary embodiment of the present disclosure, as in display device according to the exemplary embodiment described above, the display panel 200 includes the display area 220 and the non-display area 210, the passivation film 100 includes the first film portion 110 and the second film portion 120, and the modulus of the first film portion 110 is lower than that of the second film portion 120.

In the present embodiment, the first film portion 110 and the second film portion 120 of the passivation film 100 include the same material, and the first film portion 110 and the second film portion 120 thereof have different degrees of hardness. As such, since the first film portion 110 and the second film portion 120 have different degrees of hardness, the modulus of the first film portion 110 and the modulus of the second film portion 120 may be different.

Referring to FIG. 11, a passivation film resin 100a including a curable material "A" is coated on the carrier substrate 10. In an embodiment, the first film portion 110 and the second film portion 120 of the passivation film 100 have the same material, and the first film portion 110 and the second film portion 120 have different degrees of concentration and hardness of the curable material "A." Accordingly, the first film portion 110 and the second film portion 120 have different moduli.

In an embodiment, the passivation film resin 100a is a synthetic resin material that is cured by the curable material "A" and has transparency after curing, and may be, for example, polydimethylsiloxane (PDMS). The passivation film resin 100a according to the present exemplary embodiment is liquid, and is mixed with the curable material (A) and coated on the carrier substrate 10 as shown in FIG. 11.

In FIG. 11, the curable material "A" is exaggerated for understanding. When the curable material "A" is mixed with the passivation film resin 100a, it may not be visually distinguished. The curable material "A" of the present exemplary embodiment may cure the passivation film resin 100a by light or heat.

Referring to FIG. 12, in an embodiment, after a mask 20 is disposed on the first film portion 110, the passivation film resin 100a is primarily cured by irradiating light thereon. Thus, the second film portion 120 exposed without being blocked by the mask 20 is primarily cured. The mask 20 blocking the first film portion 110 according to the present exemplary embodiment, for example, may be a full-tone mask.

When the first film portion 110 is blocked by the mask 20, the curable material "A" contained in the first film portion 110 migrates toward the second film portion 120 exposed to the outside. A concentration of the curable material "A" in the first film portion 110 of the primarily cured passivation film resin 100a is lower than that before being cured, and a concentration of the curable material "A" in the second film portion 120 thereof is higher than that before being cured.

After the primary curing process is completed, all of the primarily cured passivation film resin 100a is secondarily cured by exposing the primarily cured passivation film resin 100a to light without the mask 20. The passivation film resin 100a is completed after the secondary curing to become the passivation film 100. Since the first film portion 110 is blocked by the mask 20 in the primary curing, the liquid passivation film resin 100a thereof is maintained as it is. Referring to FIG. 13, all of the passivation film resin 100a is cured without the mask 20, and, thus, both the first film portion 110 and the second film portion 120 are cured to form the passivation film 100.

Since the curable material "A" of the first film portion 110 migrates to the second film portion 120 in the primary curing process as shown in FIG. 12, the second film portion 120 includes a curable material "A" having a higher concentration than that of the first film portion 110. In addition, since the second film portion 120 has already been cured once in the primary curing process, the curing degree thereof is higher than that of the first film portion 110 through two curing processes, and, thus, the second film portion 120 has a higher rigidity and modulus than the first film portion 110.

In contrast, since the curable material "A" in the first film portion 110 migrates to the second film portion 120 by the primary curing, the first film portion 110 contains the curable material "A" at a low concentration. In addition, since the first film portion 110 of the present exemplary embodiment is blocked by the mask 20 in the first curing, the first film portion 110 is cured in only the secondary curing process. Therefore, the first film portion 110 is relatively soft and has a lower modulus than the second film portion 120.

Figure 14:
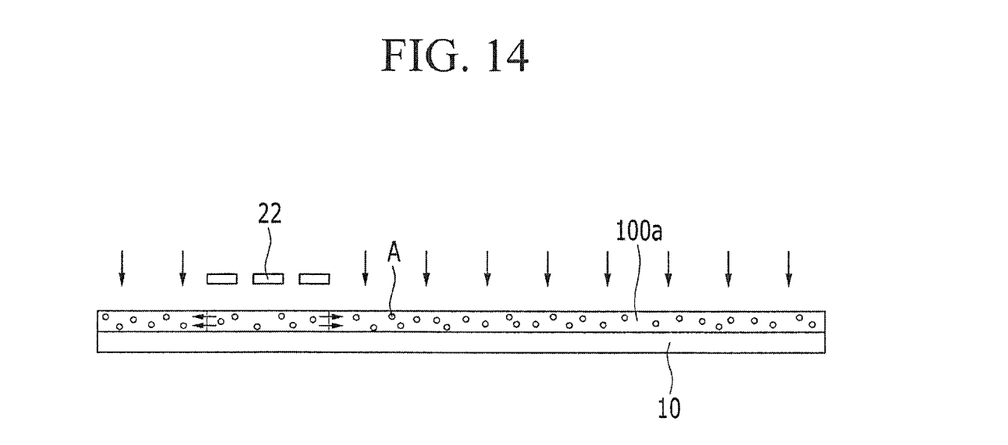
FIG. 14 illustrates a process according to an exemplary embodiment of the present disclosure in a view corresponding to the view of FIG. 12.

FIG. 14 schematically illustrates a process according to an exemplary embodiment of the present disclosure in a view corresponding to the view of FIG. 12. When the primary curing process is performed as in the embodiment of FIG. 14, the passivation film resin 100a may be blocked by a half-tone mask 22. Thus, the second film portion 120 exposed without being blocked by the half-tone mask 22 is primarily cured.

A light blocking rate of the light blocking mask used in the primary curing process may be appropriately varied according to a degree of the modulus required in the first film portion 110.

The display device and a manufacturing method thereof according to an exemplary embodiment of the present disclosure have been described above. According to the present exemplary embodiment, since the first film portion 110 has a lower modulus than the second film portion 120 according to a degree of curing, it is possible to prevent or substantially prevent physical damage that may occur during bending.

Herein, a display device and a manufacturing method thereof according to further exemplary embodiments of the present disclosure will be described with reference to FIG. 15 to FIG. 19. Here, further description of configurations that are the same as those of the above-described exemplary embodiment of the present disclosure will be omitted.

Figure 15:
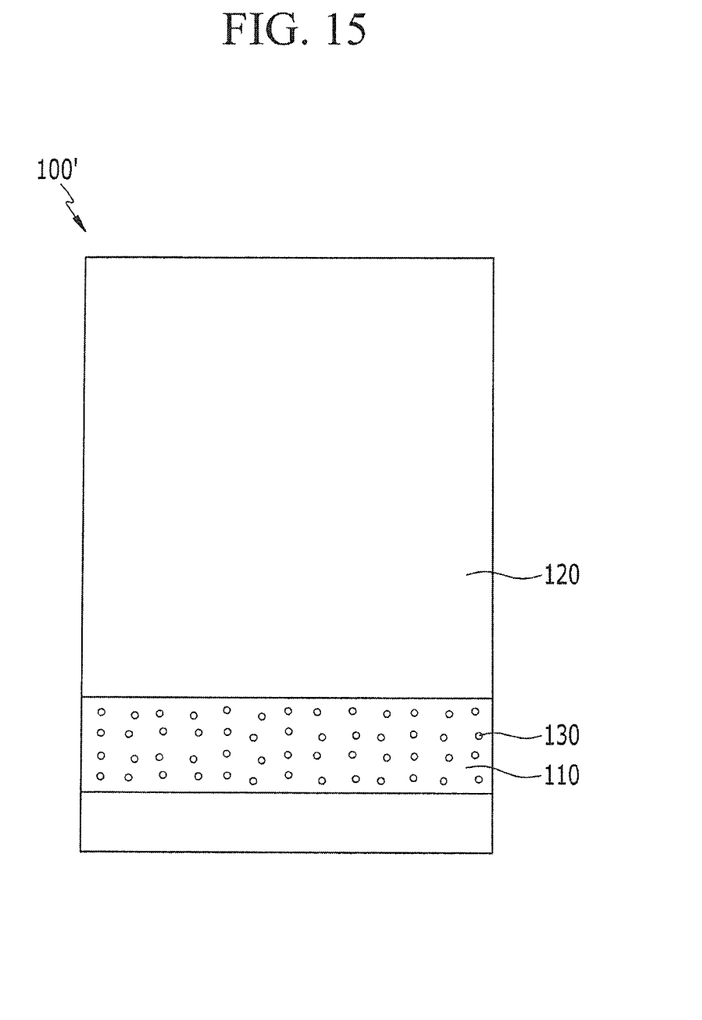
FIG. 15 illustrates a top plan view of a passivation film according to another exemplary embodiment of the present disclosure.
Figure 16:
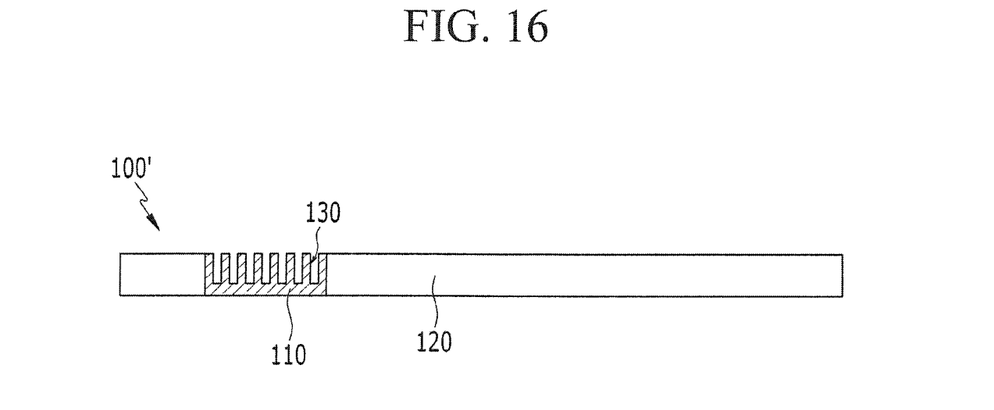
FIG. 16 illustrates a cross-sectional view of the passivation film shown in FIG. 15.

FIG. 15 illustrates a top plan view of a passivation film 100' according to another exemplary embodiment of the present disclosure; and FIG. 16 illustrates a cross-sectional view of the passivation film 100' shown in FIG. 15. Referring to FIG. 15 and FIG. 16, as in the display devices according to the exemplary embodiments described above, the display panel 200 of the display device according to an exemplary embodiment of the present disclosure includes the display area 220 and the non-display area 210, the passivation film 100' thereof includes the first film portion 110 and the second film portion 120, and the modulus of the first film portion 110 is lower than that of the second film portion 120.

The first film portion 110 of the present exemplary embodiment is provided with a plurality of pores 130. In an embodiment, the plurality of pores 130 is formed by removing some of the first film portion 110, and the pores 130 according to the present embodiment may be formed by laser processing or by punching, for example.

For example, when a material of the first film portion 110 has a modulus of 3 GPa, some of the first film portion 110 may be removed by a volume of 95% or less to form the plurality of pores 130. However, the present disclosure is not limited thereto, and the volume of the first film portion 110 removed depending on the modulus of a material for the first film portion 110 may be varied.

As shown in FIG. 15 and FIG. 16, in an embodiment, the plurality of pores 130 may be formed only in the first film portion 110 while the first film portion 110 includes a material having a lower modulus than that of the second film portion 120. However, the present disclosure is not limited thereto and, in another embodiment, the first film portion 110 and the second film portion 120 may include a material having the same modulus, and only the first film portion 110 may have the plurality of pores 130.

As such, the first film portion 110 has the plurality of pores 130, and, thus, the modulus of the first film portion 110 is lower than that of the second film portion 120.

In FIG. 16, although it is illustrated that the pores 130 do not penetrate through the first film portion 110 and a bottom portion of the first film portion 110 is not penetrated, the present disclosure is not limited thereto. That is, although not shown, the plurality of pores 130 penetrating through the first film portion 110 is included in the scope of the present disclosure.

Figure 17:
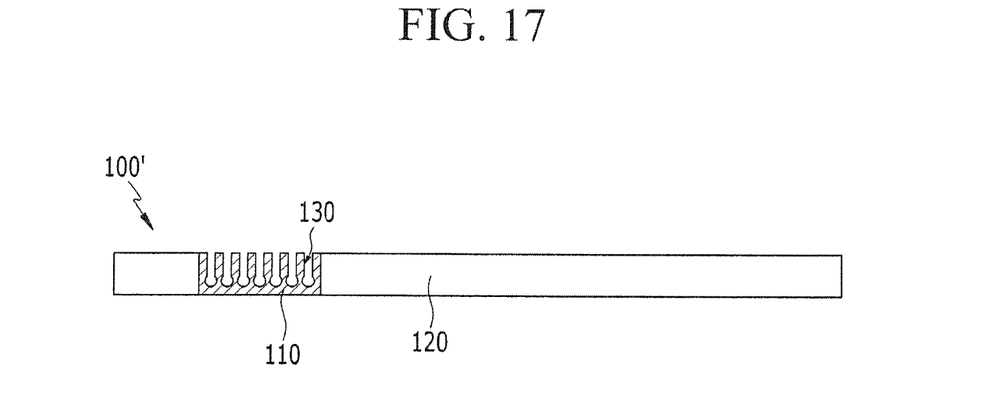
FIG. 17 illustrates a cross-sectional view of the passivation film of FIG. 16 on which an etching process is performed.

Referring to FIG. 17, in an embodiment, surface areas of the pores 130 may be widened by further performing an etching process in the plurality of pores 130. In an embodiment, the etching process may be a wet etching process. When the pores 130 are coated with an etchant and then etched, the plurality of pores 130 having irregular surfaces as shown in FIG. 17 is formed. When the etching process is used, inner surface areas of the pores 130 may be formed to be greater than when a laser process or punching process is used. Therefore, since stress is more easily dispersed during bending, physical damage due to the bending may be prevented or substantially prevented.

Figure 18:
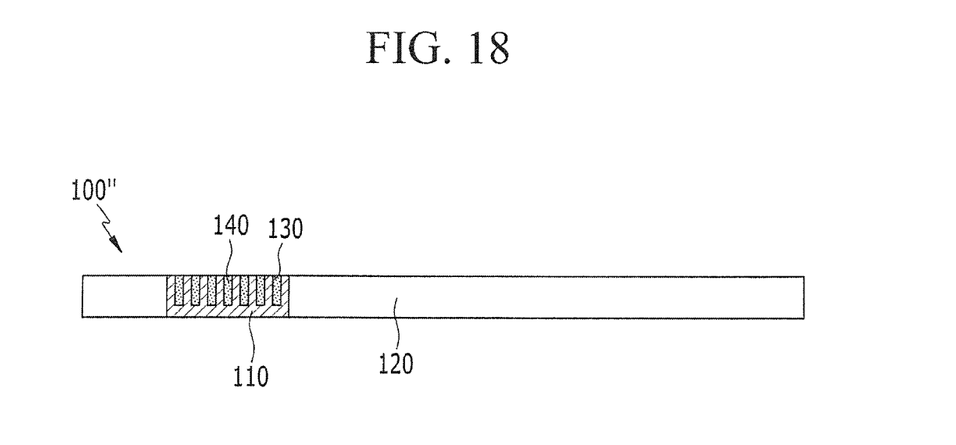
FIG. 18 illustrates a passivation film according to an exemplary embodiment of the present disclosure in a view corresponding to the view of FIG. 16.
Figure 19:
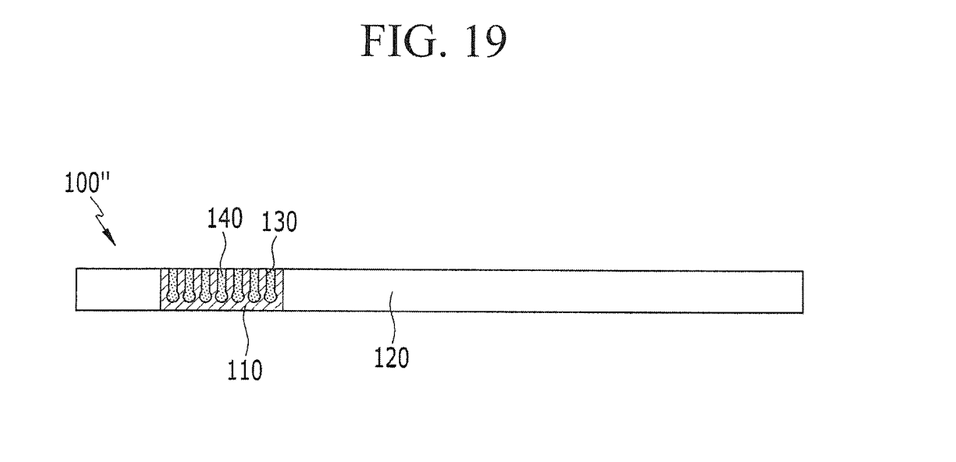
FIG. 19 illustrates a passivation film according to an exemplary embodiment of the present disclosure in a view corresponding to the view of FIG. 17.

FIG. 18 illustrates a passivation film according to an exemplary embodiment of the present disclosure in a view corresponding to the view of FIG. 16; and FIG. 19 illustrates a passivation film according to an exemplary embodiment of the present disclosure in a view corresponding to the view of FIG. 17. As shown in FIG. 18 and FIG. 19, in a passivation film 100", a filler 140 may be filled in the plurality of pores 130. The filler 140 may be a material having a lower modulus than that of the first film portion 110, such that even if the filler 140 is filled in the plurality of pores 130, since the filler 140 is a material having a lower modulus than that of the first film portion 110, it is easier to deform. Therefore, similar to the above, stress may be more easily dispersed during bending, such that physical breakage due to the bending may be prevented or substantially prevented.

The display device and a manufacturing method thereof according to exemplary embodiments of the present disclosure have been described above. According to the present exemplary embodiments, when the display panel 200 is bent toward the opposite side of the display surface of the display area 220 to reduce the non-display area 210, since the first film portion 110 attached to the non-display area 210 has a low modulus, stress and deformation caused by bending may be reduced to prevent or substantially prevent physical damage to the display panel 200.

Although some exemplary embodiments have been described and illustrated, the present disclosure is not limited to the exemplary embodiments described herein, and it will be apparent to those skilled in the art that various changes and modifications may be made to these embodiments without departing from the spirit and scope of the present invention. Therefore, it should be appreciated that any of such varied or modified embodiments are to be included within the spirit and scope of the present invention, as set forth in the appended claims of the present disclosure.

What is claimed is:

1. A manufacturing method of a display device, the manufacturing method comprising:
preparing a passivation film including a first film portion and a second film portion on a carrier substrate;
separating the carrier substrate from the passivation film;
attaching a display panel to a surface of the passivation film; and
bending the first film portion and a portion of the display panel,
wherein the first film portion is made of a first material having a modulus that is lower than a modulus of a second material that is different from the first material and of which the second film portion is made,
wherein the display panel includes a display area and a non-display area that extends from an end of the display area and is bent toward the display area,
wherein the passivation film is attached to an entire surface of the display panel and includes the first film portion that is disposed in the non-display area and is bent toward the display area and the second film portion that is flush with both ends of the first film and disposed in an area overlapping with the display area when viewed from a top surface of the display area, and the first film portion is not overlapping with the display area, and
wherein an entire side surface of the second film portion at a junction between the first film portion and the second film portion contacts the first material of the first film portion.

2. The manufacturing method of claim 1, wherein
the preparing the passivation film including the first film portion and the second film portion on the carrier substrate comprises:
attaching the first film portion on the carrier substrate; and
attaching the second film portion extending from a side of the first film portion on the carrier substrate to prepare the passivation film,
the bending the first film portion and the portion of the display panel comprises:
locally heating the first film portion to bend the first film portion,
wherein the first material is a thermoplastic material, and
wherein the second material is a heat resistant material.

3. The manufacturing method of claim 2, wherein a glass transition temperature of the first film portion is lower than a glass transition temperature of the second film portion.

4. The manufacturing method of claim 3, wherein, in the heating of the first film portion, the first film portion is heated to a temperature of equal to or greater than the glass transition temperature of the first film portion and heated to a temperature of less than the glass transition temperature of the second film portion.

5. The manufacturing method of claim 1, wherein
the preparing the passivation film including the first film portion and the second film portion on the carrier substrate comprises:
attaching the first film portion on the carrier substrate; and
attaching the second film portion extending from a side of the first film portion on the carrier substrate to prepare the passivation film;
the bending the first film portion and the portion of the display panel comprises locally heating the first film portion to bend the first film portion, and
the manufacturing method further comprises forming a neutral surface adjustment member on a surface of the display panel opposite to the surface of the display panel attached to the first film portion.

6. The manufacturing method of claim 1, wherein
the preparing the passivation film including the first film portion and the second film portion on the carrier substrate comprises:
coating a passivation film resin including a curable material on the carrier substrate;
primarily curing a second film portion of the passivation film resin except for a first film portion of the passivation film resin by disposing a mask blocking the first film portion of the passivation film resin; and removing the mask and then secondarily curing all of the passivation film resin to prepare the passivation film.

7. The manufacturing method of claim 6, wherein the mask is a full-tone mask or a half-tone mask.

8. The manufacturing method of claim 6, wherein
the passivation film resin including the curable material is cured by light or heat, and
in each of the primarily curing and the secondarily curing, light or heat is applied to the passivation film resin.

9. The manufacturing method of claim 1, wherein
the preparing the passivation film including the first film portion and the second film portion on the carrier substrate comprises:
attaching a material for the first film portion on the carrier substrate; and
forming a plurality of pores in the first film portion of the passivation film.

10. The manufacturing method of claim 9, further comprising etching the plurality of pores.

11. The manufacturing method of claim 9, wherein the plurality of pores is formed by a laser process or a punching process.

12. The manufacturing method of claim 9, further comprising filling a filler having a lower modulus than a modulus of the material for the passivation film in the plurality of pores.

13. A display device comprising:
a display panel including a display area and a non-display area that extends from an end of the display area and is bent toward the display area; and
a passivation film attached to an entire surface of the display panel and including a first film portion that is disposed in the non-display area and is bent toward the display area, and a second film portion that is flush with both ends of the first film and disposed in an area overlapping with the display area when viewed from a top surface of the display area,
wherein the first film portion is made of a first material having a modulus that is lower than a modulus of a second material that is different from the first material and of which the second film portion is made, and the first film portion is not overlapping with the display area, and
wherein an entire side surface of the second film portion at a junction between the first film portion and the second film portion contacts the first material of the first film portion.

14. The display device of claim 13, wherein
the first material is a thermoplastic material, and
the second material is a heat resistant material.

15. The display device of claim 14, wherein a glass transition temperature of the first film portion is lower than a glass transition temperature of the second film portion.

16. The display device of claim 13, wherein
each of the first film portion and the second film portion includes a curable material, and
a concentration of the curable material of the second film portion is higher than a concentration of the curable material of the first film portion.

17. The display device of claim 16, wherein the first film portion and the second film portion including the curable material are respectively cured by light or heat.

18. The display device of claim 13, wherein the first film portion is provided with a plurality of pores.

19. The display device of claim 18, wherein the passivation film has a lower modulus than a modulus of the first film portion, and includes a filler filled in the plurality of pores.

20. The display device of claim 13, further comprising a neutral surface adjustment member on a surface of the non-display area opposite to the surface of the non-display area attached to the first film portion.

* * * * *